US008945955B2

(12) United States Patent
Chen et al.

(10) Patent No.: US 8,945,955 B2
(45) Date of Patent: Feb. 3, 2015

(54) METHOD OF CHANGING REFLECTANCE OR RESISTANCE OF A REGION IN AN OPTOELECTRONIC MEMORY DEVICE

(71) Applicant: International Business Machines Corporation, Armonk, NY (US)

(72) Inventors: Fen Chen, Williston, VT (US); Richard Steven Kontra, Williston, VT (US); Tom C. Lee, Essex Junction, VT (US); Theodore M. Levin, Winooski, VT (US); Christopher David Muzzy, Burlington, VT (US); Timothy Dooling Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/765,772

(22) Filed: Feb. 13, 2013

(65) Prior Publication Data
US 2013/0258765 A1 Oct. 3, 2013

Related U.S. Application Data

(60) Continuation of application No. 13/558,541, filed on Jul. 26, 2012, now abandoned, which is a continuation of application No. 12/842,158, filed on Jul. 23, 2010, now Pat. No. 8,288,747, which is a division of application No. 11/161,941, filed on Aug. 23, 2005, now Pat. No. 7,768,815.

(51) Int. Cl.
*G01R 31/26* (2014.01)
*H01L 21/66* (2006.01)
(Continued)

(52) U.S. Cl.
CPC ........ *G11C 13/0009* (2013.01); *G11C 13/0004* (2013.01); *G11C 13/004* (2013.01);
(Continued)

(58) Field of Classification Search
USPC ....................................................... 438/16, 466
See application file for complete search history.

(56) References Cited

U.S. PATENT DOCUMENTS 3,887,906 A * 6/1975 Minnaja ........................... 365/1
5,268,973 A 12/1993 Jenevein
(Continued)

OTHER PUBLICATIONS

PVEducation.org article on "Photon Flux" pp. 2 available at http://www.pveducation.org/pvcdrom/properties-of-sunlight/photon-flux as of Jul. 6, 2014.*
(Continued)

*Primary Examiner* — Yu-Hsi D Sun
*Assistant Examiner* — Grant Withers
(74) *Attorney, Agent, or Firm* — Schmeiser, Olsen & Watts, LLP; Michael LeStrange

(57) ABSTRACT

A method for changing reflectance or resistance of a region in an optoelectronic memory device. Changing the reflectance of the region includes sending an electric current through the region to cause a reflectance change in the region. Changing the resistance of the region includes: projecting a laser beam at a first beam intensity on the region, resulting in the region changing from a first to a second different resistance value; electrically reading the second resistance value during which an optical signal carried by the laser beam has a first digital value; after electrically reading the second resistance value, the laser beam is projected at a second beam intensity on the region resulting in the region changing from the second to the first resistance value; and electrically reading the first resistance value of the region while the laser beam is being projected on the region at the second beam intensity.

9 Claims, 3 Drawing Sheets

(51) Int. Cl.
*G11C 13/00* (2006.01)
*G11C 13/04* (2006.01)
*H01L 45/00* (2006.01)

(52) U.S. Cl.
CPC .......... *G11C13/047* (2013.01); *H01L 45/1213* (2013.01); *H01L 45/145* (2013.01); *G11C 13/04* (2013.01); *G11C 2013/0054* (2013.01)
USPC ............................................ 438/16; 438/466

(56) References Cited

U.S. PATENT DOCUMENTS

| | | | |
|---|---|---|---|
| 5,315,105 | A | 5/1994 | Matsuda et al. |
| 5,373,348 | A | 12/1994 | Inoue et al. |
| 5,410,502 | A * | 4/1995 | Bird ................................ 365/108 |
| 5,412,595 | A | 5/1995 | Shannon |
| 5,615,143 | A * | 3/1997 | MacDonald et al. ......... 365/112 |
| 5,773,316 | A * | 6/1998 | Kurosaki et al. ................ 438/16 |
| 5,994,757 | A * | 11/1999 | Ichikawa et al. ............... 257/530 |
| 6,040,198 | A * | 3/2000 | Komiya et al. .................. 438/16 |
| 6,193,899 | B1 * | 2/2001 | Ohlig ............................... 216/85 |
| 7,471,552 | B2 | 12/2008 | Parkinson et al. |
| 7,501,648 | B2 | 3/2009 | Chen et al. |
| 7,595,554 | B2 | 9/2009 | Yang |
| 7,645,621 | B2 * | 1/2010 | Brodsky et al. .................. 438/16 |
| 7,768,815 | B2 | 8/2010 | Chen et al. |
| 7,883,907 | B2 * | 2/2011 | Taylor ............................... 438/14 |
| 7,924,692 | B2 * | 4/2011 | Liem et al. ..................... 369/126 |
| 7,945,962 | B2 * | 5/2011 | Maeda et al. ....................... 850/1 |
| 8,288,747 | B2 | 10/2012 | Chen et al. |
| 2003/0054639 | A1 | 3/2003 | Deliwala |
| 2004/0057314 | A1 | 3/2004 | Pavlichek |
| 2005/0162892 | A1 | 7/2005 | Bardouillet et al. |
| 2006/0145291 | A1 * | 7/2006 | Badami et al. ................. 257/529 |
| 2012/0012810 | A1 * | 1/2012 | Thylen et al. ....................... 257/4 |

OTHER PUBLICATIONS

Notice of Allowance (Mail Date: Mar. 24, 2010) for U.S. Appl. No. 11/161,941, Filing Date Aug. 23, 2005; Confirmation No. 2940.

Lovejoy, et al.; "Thin-film tantalum-nitride resistor technology for phosphide-based optoelectronics"; 1996 Thin Solid Films vol. 290-291; pp. 513-517.

Yamada, et al.; Rapid-phase Transitions of GeTe-Sb2-3 Psuedobinary Amorphous Thin Films for an Optical disk Memory; J.Appl.Phys. 69(5), Mar. 1, 1991; 9 pages.

* cited by examiner

METHOD OF CHANGING REFLECTANCE OR RESISTANCE OF A REGION IN AN OPTOELECTRONIC MEMORY DEVICE

This application is a continuation application claiming priority to Ser. No. 13/558,541, filed Jul. 26, 2012, now abandoned, which is a continuation of Ser. No. 12/842,158, filed Jul. 23, 2010, now U.S. Pat. No. 8,288,747 issued Oct. 16, 2012, which is a divisional application claiming priority to Ser. No. 11/161,941, filed Aug. 23, 2005, now U.S. Pat. No. 7,768,815 issued Aug. 3, 2010.

BACKGROUND OF THE INVENTION

1. Technical Field

The present invention relates to memory devices, and more specifically, to optoelectronic memory devices.

2. Related Art

A memory cell in a typical semiconductor memory device usually comprises one or more transistors and can store one of two possible values depending on the voltage potential of a certain node of the memory cell. For instance, the memory cell can be considered storing a 1 if the node is at 5V and storing a 0 if the node is at 0V. As a result, the memory cell is an electronic memory cell. In order to write the electronic memory cell, an appropriate voltage potential is applied to the node (or another node) of the electronic memory cell. In order to read the content of the electronic memory cell, the voltage potential of the node (or another node) of the electronic memory cell can be sensed and then amplified by a sensor-amplifier (sense-amp) circuit. However, electrical digital signal transmission is usually slower than optical digital signal propagation. Therefore, it would speed up the write and read cycles of the memory cell if either or both of the write and read cycles can be performed optically. As a result, there is a need for an optoelectronic memory device that (a) can be written optically (i.e., by light) or electrically (by applying voltage) and/or (b) can be read optically (i.e., by light) or electrically (by sensing voltage).

SUMMARY OF THE INVENTION

The present invention provides a method, comprising providing a resistive/reflective region on a substrate, wherein the resistive/reflective region comprises a material having a characteristic of changing the material's reflectance due to a phase change in the material; sending an electric current through the resistive/reflective region so as to cause a reflectance change in the resistive/reflective region from a first reflectance value to a second reflectance value different from the first reflectance value; and optically reading the reflectance change in the resistive/reflective region.

The present invention also provides a method, comprising providing a resistive/reflective region on a substrate, wherein the resistive/reflective region comprises a material having a characteristic of changing the material's resistance due to the material absorbing heat; projecting a laser beam on the resistive/reflective region so as to cause a resistance change in the resistive/reflective region from a first resistance value to a second resistance value different from the first resistance value; and electrically reading the resistance change in the resistive/reflective region.

The present invention also provides a structure, comprising (a) N regular resistive/reflective regions on a substrate, N being a positive integer, wherein the N regular resistive/reflective regions comprise a material having a characteristic of changing the material's resistance and reflectance due to the material absorbing heat; (b) N sense-amp circuits electrically coupled one-to-one to the N regular resistive/reflective regions, wherein each sense-amp circuit of the N sense-amp circuits is adapted for recognizing a resistance change in the associated regular resistive/reflective region; and (c) a light source/light detecting device optically coupled to the N regular resistive/reflective regions, wherein the light source/light detecting device is adapted for recognizing a reflectance change in each regular resistive/reflective region of the N regular resistive/reflective regions.

The present invention provides an optoelectronic memory device that (a) can be written optically (i.e., by light) or electrically (by applying voltage) and/or (b) can be read optically (i.e., by light) or electrically (by sensing voltage).

DETAILED DESCRIPTION OF THE INVENTION

Figure 1:
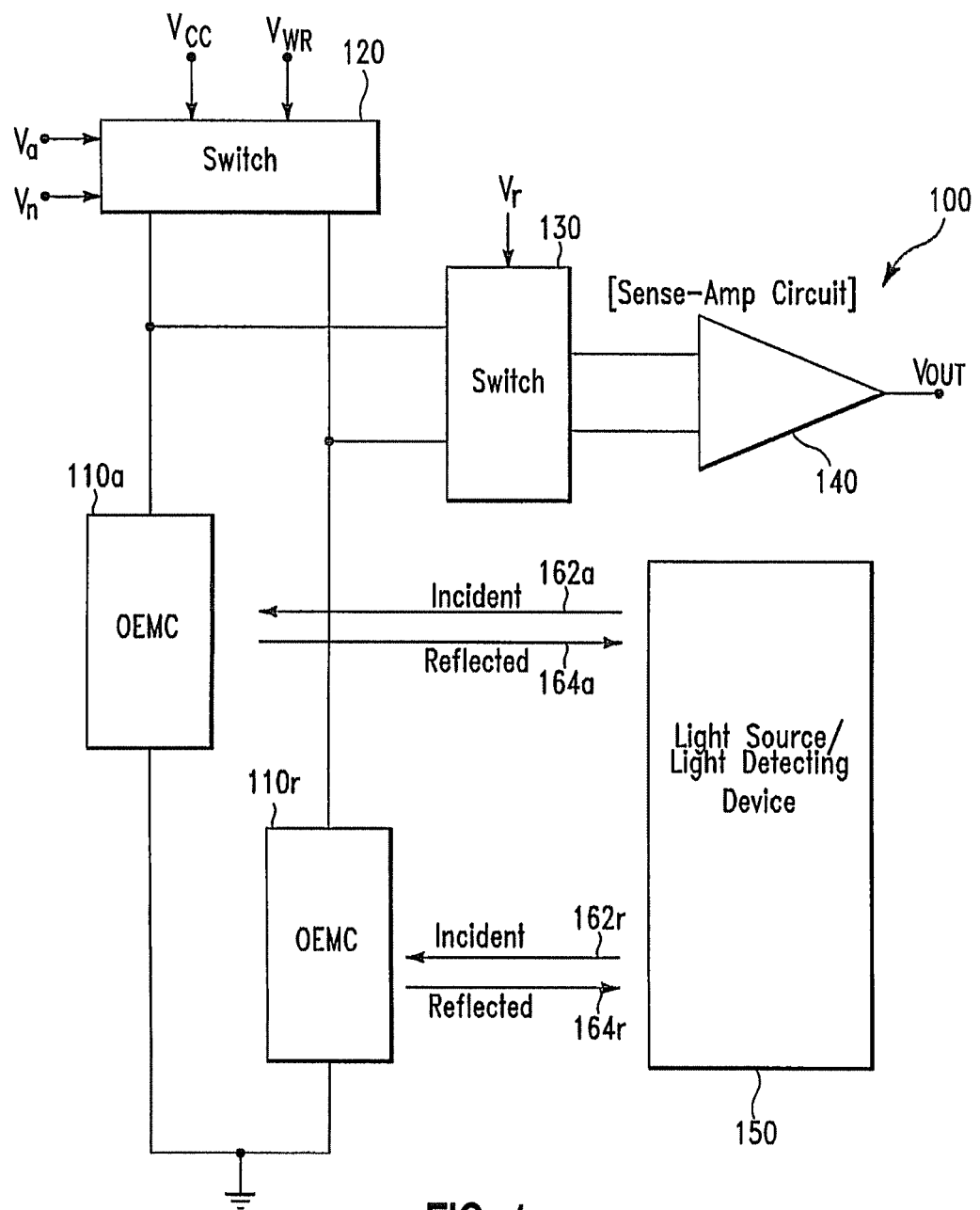
FIG. 1 illustrates an optoelectronic memory device, in accordance with embodiments of the present invention.

FIG. 1 illustrates an optoelectronic memory device 100, in accordance with embodiments of the present invention. More specifically, the optoelectronic memory device 100 comprises, illustratively, two optoelectronic memory cells (OEMC) 110a and 110r. The optoelectronic memory device 100 further comprises a switch 120 for applying voltage potentials Vcc and $V_{WR}$ to the OEMC 110a and 110r in a manner controlled by the control signals Va and Vr (further details are discussed below).

The optoelectronic memory device 100 further comprises a switch 130, a sensor-amplifier (sense-amp) circuit 140, and a light source/light detecting device 150. The switch 130 electrically couples the OEMC 110a and 110r to the sense-amp circuit 140 in a manner controlled by the control signal Vr, whereas the light source/light detecting device 150 is optically coupled to the OEMC 110a and 110r (further details are discussed below).

Figure 2:
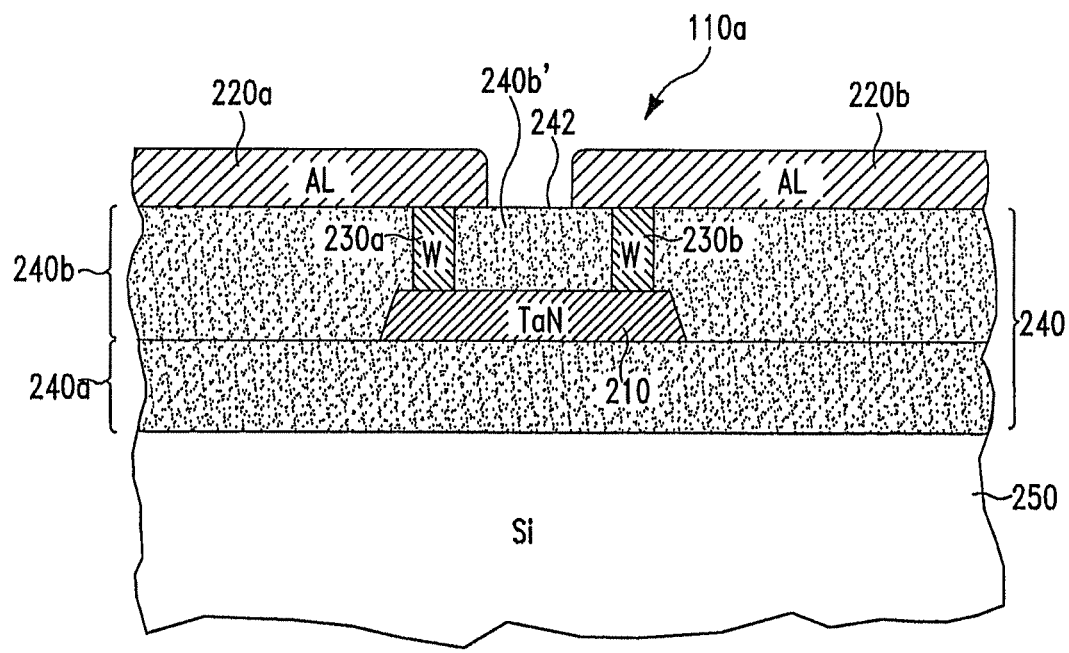
FIG. 2 illustrates one embodiment of optoelectronic memory cells of the optoelectronic memory device of FIG. 1, in accordance with embodiments of the present invention.

FIG. 2 illustrates one embodiment of the OEMC 100a of FIG. 1, in accordance with embodiments of the present invention. More specifically, the OEMC 100a comprises a resistive/reflective region 210 (comprising tantalum nitride TaN in one embodiment) embedded in a dielectric layer 240. The dielectric layer 240 (comprising silicon dioxide $SiO_2$ in one embodiment) is formed on a semiconductor (e.g., silicon) layer 250.

In one embodiment, the TaN resistive/reflective region 210 is electrically coupled to two electrically conducting lines 220a and 220b through two vias 230a and 230b, respectively. Illustratively, the electrically conducting lines 220a and 220b comprise aluminum (Al) or Copper (Cu) or any other metals, whereas the vias 230a and 230b comprise tungsten (W) or Cu or any other metals. In one embodiment, the Al line 230a of the OEMC 100a is coupled to the switch 120 (FIG. 1) whereas the Al line 230b of the OEMC 100a is coupled to ground (FIG. 1).

In one embodiment, the fabrication of the OEMC 100a can start out with the silicon layer 250. Next, in one embodiment, a $SiO_2$ layer 240a (the lower portion of the silicon dioxide layer 240) is formed on top of the silicon layer 250 by, illustratively, CVD (chemical vapor deposition) of $SiO_2$.

Next, in one embodiment, the TaN resistive/reflective region 210 is formed on top of the $SiO_2$ layer 240a. Illustratively, the TaN resistive/reflective region 210 is formed on top of the $SiO_2$ layer 240a by (i) blanket depositing a TaN layer (not shown) on top of the $SiO_2$ layer 240a and then (ii) directionally and selectively etching the deposited TaN layer such that what remains of the deposited TaN layer is the TaN resistive/reflective region 210.

Next, in one embodiment, a $SiO_2$ layer 240b (the upper portion of the silicon dioxide layer 240) is formed on top of the $SiO_2$ layer 240a and the TaN resistive/reflective region 210 by illustratively CVD of $SiO_2$. As a result, the TaN resistive/reflective region 210 is embedded in the $SiO_2$ layer 240.

Next, in one embodiment, the two W vias 230a and 230b are formed (i) in the $SiO_2$ layer 240b and (ii) in electrical contact with the TaN resistive/reflective region 210. Illustratively, the two W vias 230a and 230b are formed by (a) creating two holes 230a and 230b by any conventional lithographic process such that the TaN resistive/reflective region 210 is exposed to the surrounding ambient via the holes 230a and 230b, then (b) blanket depositing a tungsten layer (not shown) so as to fill the two holes 230a and 230b with tungsten, and then (c) planarizing the deposited tungsten layer until a top surface 242 of the $SiO_2$ layer 240b is exposed to the surrounding ambient.

Next, in one embodiment, the two Al lines 220a and 220b are formed (i) on top of $SiO_2$ layer 240b and (ii) in electrical contact with the two W vias 230a and 230b, respectively. Illustratively, the two Al lines 220a and 220b are formed by (a) blanket depositing an Al layer (not shown) on top of the $SiO_2$ layer 240b and the two W vias 230a and 230b, and then (b) directionally and selectively etching the deposited Al layer such that what remain of the deposited Al layer are the two Al lines 220a and 220b.

In one embodiment, the structure of the OEMC 110r is similar to the structure of the OEMC 110a described above. Moreover, the OEMC 110r is coupled to the switch 120 and ground (FIG. 1) in a manner similar to the manner in which the OEMC 110a is coupled to the switch 120 and ground (FIG. 1).

Figure 3:
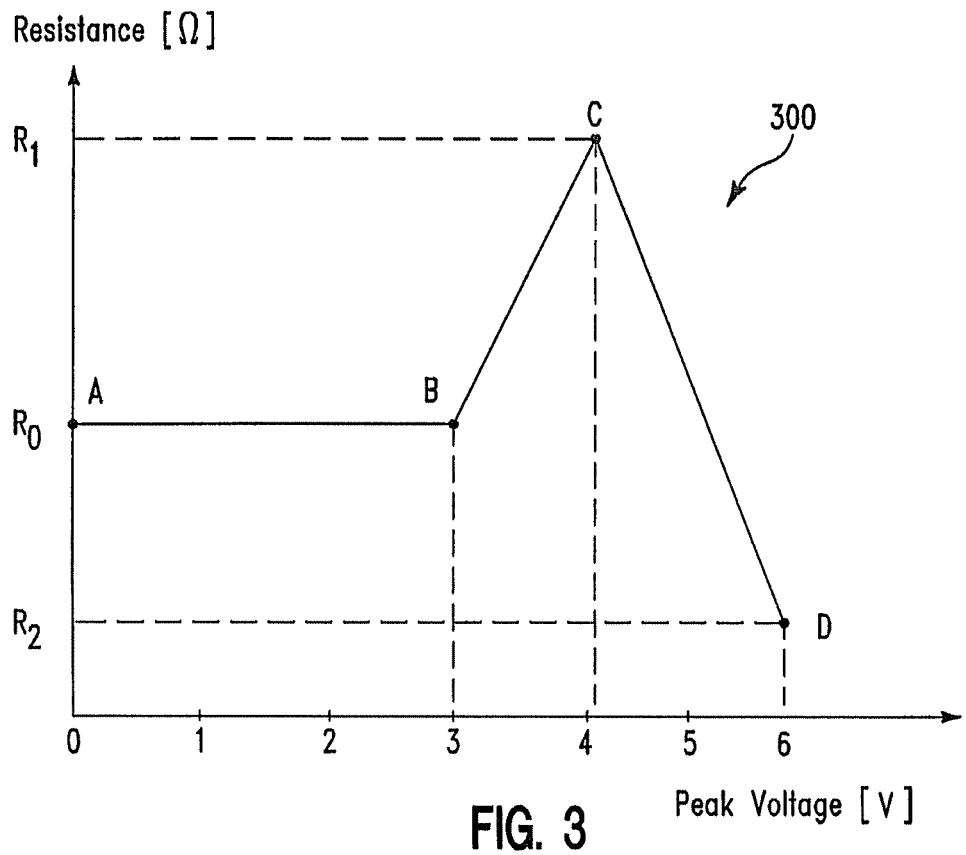
FIG. 3 illustrates how an applied voltage pulse affects the resistance of the optoelectronic memory cell of FIG. 2, in accordance with embodiments of the present invention.

FIG. 3 shows a plot 300 illustrating how an applied voltage pulse affects the resistance of the TaN resistive/reflective region 210 of the optoelectronic memory cell 110a of FIG. 2, in accordance with embodiments of the present invention. More specifically, the inventors of the present invention have found that a voltage pulse applied across the TaN resistive/reflective region 210 (FIG. 2) changes both the resistance and the reflectance of the TaN resistive/reflective region 210 (FIG. 2). The reflectance is defined as the ratio of the photon flux reflected by a surface to the photon flux incident on the surface. In one embodiment, the applied voltage pulse can have a triangular shape. More specifically, the applied voltage pulse comprises an increase from 0V to a peak voltage and then a voltage drop back to 0V.

The inventors of the present invention have found that, for a particular size of the TaN resistive/reflective region 210 (FIG. 2), if the peak voltage of the applied voltage pulse is between V1 and V2 (for example, V1 and V2 can be 3V and 4V, respectively, represented by segment B-C of the plot 300 is applicable), then both the resistance and the reflectance of the TaN resistive/reflective region 210 (FIG. 2) change as a result of the applied voltage pulse. More specifically, in this segment B-C of the plot 300, the higher the peak voltage of the applied voltage pulse, the higher the resulting resistance and the reflectance of the TaN resistive/reflective region 210 (FIG. 2). For example, assume the resistance of the TaN resistive/reflective region 210 (FIG. 2) is originally $R_0$, and that a voltage pulse having a peak voltage of V2 (i.e., 4V in the example above) is applied across the TaN resistive/reflective region 210 (FIG. 2). After the pulse is removed, the resistance of the TaN resistive/reflective region 210 (FIG. 2) is $R_1$. Also after the pulse is removed, the TaN resistive/reflective region 210 (FIG. 2) has a higher reflectance.

It should be noted that the change in resistance and reflectance of the TaN resistive/reflective region 210 (FIG. 2) in the example above with respect to segment B-C of the plot 300 is irreversible. For illustration, assume that after the pulse described above is removed, another voltage pulse having a peak voltage of V1 (i.e., 3V in the example above) is applied across the TaN resistive/reflective region 210 (FIG. 2). The resistance and reflectance of the TaN resistive/reflective region 210 (FIG. 2) would not change back to original values, but remain essentially unchanged (i.e., $R_1$ for resistance).

Figure 4A:
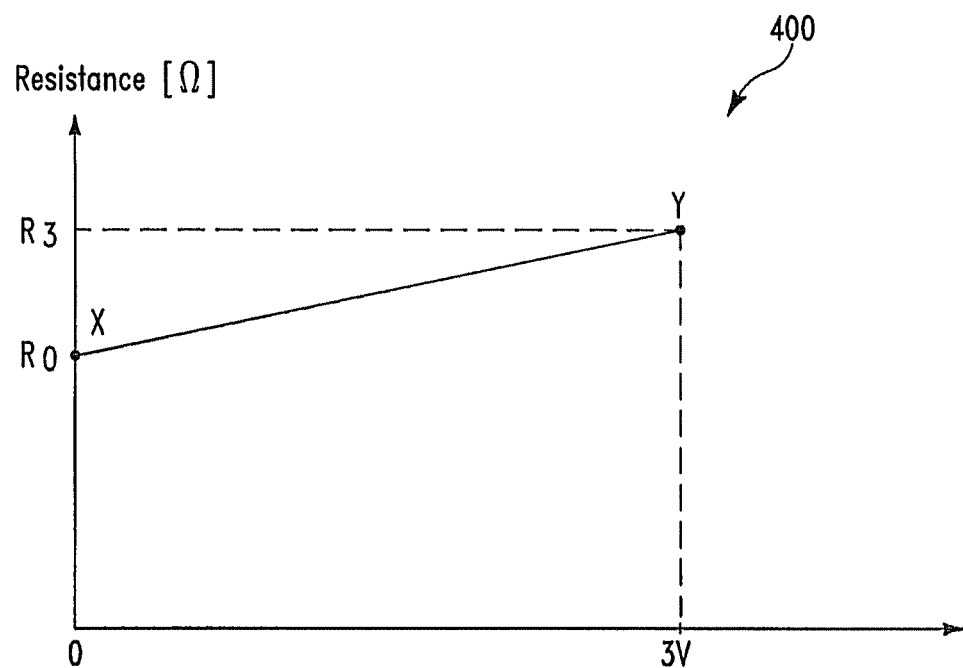
FIGS. 4A and 4B illustrate how an applied voltage affects the resistance of the optoelectronic memory cell of FIG. 2, when the material of the resistive/reflective region has a positive temperature coefficient of resistance (TCR) and a negative TCR, respectively, in accordance with embodiments of the present invention.

FIG. 4A shows a plot 400 illustrating how an applied voltage affects the resistance of the optoelectronic memory cell of FIG. 2, in accordance with embodiments of the present invention. More specifically, the inventors of the present invention have found that both the resistance and the reflectance of the TaN resistive/reflective region 210 (FIG. 2) change reversibly in response to the applied voltage between 0V and V1 (in one case, V1=3V). For instance, when the applied voltage changes from 0V to V1, the resistance of the TaN resistive/reflective region 210 (FIG. 2) increases from $R_0$ to $R_3$. Also, although not shown, the reflectance of the TaN resistive/reflective region 210 (FIG. 2) increases (i.e., less transparent). However, when the applied voltage changes from V1 back to 0V, the resistance and reflectance of the TaN resistive/reflective region 210 (FIG. 2) change back to the original values (i.e., reversible).

With reference to FIGS. 1-4A, in one embodiment, the operation of the optoelectronic memory device 100 is as follows, assuming that the OEMC 110a and 110r operate in the segment B-C of the plot 300 (FIG. 3).

In one embodiment, the OEMC 110a can be electrically written. Assuming that a 1 is to be written into the OEMC 110a, then Va and Vr can be adjusted such that the switch 120 electrically couples OEMC 110a to signal $V_{WR}$ such that a voltage pulse of signal $V_{WR}$ having a peak voltage of V2 (i.e., 4V in the example above) is applied across the OEMC 110a. As a result of the pulse, the resistance of the TaN resistive/reflective region 210 (FIG. 2) change from $R_0$ (initial resistance) to and stays at $R_1$. Also as a result of the pulse, the reflectance of the TaN resistive/reflective region 210 (FIG. 2) increases (and remains high even after the pulse is removed).

In one embodiment, the content of the OEMC 110a can be electrically read. More specifically, Va and Vr can be adjusted such that the switch 120 electrically couples the OEMCs 110a and 110r to Vcc and such that the switch 130 electrically couples the OEMCs 110a and 110r to the sense-amp circuit 140. Because the resistance of the OEMC 110a is high ($R_1$) while the resistance of the OEMC 110r stays at $R_0$, the sense-amp circuit 140 can recognize such a difference (by comparing the voltage drops across the OEMC 110a and 110r) and accordingly generates a 1 at its output Vout, indicating that the OEMC 110*a* stores a 1. It should be noted here that the OEMC 110*r* is used as a reference memory cell for reading the content of the OEMC 110*a*.

In an alternative embodiment, the content of the OEMC 110*a* can be optically read. More specifically, the light source/light detecting device 150 can generate identical incident beams 162*a* and 162*r* (e.g., lasers) to the OEMCs 110*a* and 110*r*, respectively, and receives the reflected beams 164*a* and 164*r* from the OEMCs 110*a* and 110*r*, respectively. In one embodiment, the incident laser beams 162*a* and 162*r* have 1.3 µm wavelength with a laser pulse duration of 15 ns and with a laser energy in a range of 0.035 µj to 0.095 µj. Because the OEMCs 110*a* is more reflective than the OEMC 110*r* (as a result of the applied voltage pulse during the write cycle described above), the light source/light detecting device 150 can recognize the difference in the intensities of the reflected beams 164*a* and 164*r* from the OEMCs 110*a* and 110*r*, respectively, and accordingly generates a 1 indicating that OEMC 110*a* stores a 1. It should be noted here that the OEMC 110*r* is used as a reference memory cell for reading the content of the OEMC 110*a*.

The inventors of the present invention have found that an incident beam (e.g., a laser) can have the same effect as a voltage pulse with respect to changing the resistance and reflectance of the TaN resistive/reflective region 210 (FIG. 2). This is because both the laser beam and the voltage pulse have the same effect of generating heat in the TaN resistive/reflective region 210 (FIG. 2), resulting in a phase change in the material of resistive/reflective region 210 (FIG. 2) leading to the change in the resistance and reflectance of the TaN resistive/reflective region 210 (FIG. 2) as described above. In the case of the voltage pulse, the voltage pulse generates an electric current that passes through and hence generates heat in the TaN resistive/reflective region 210 (FIG. 2). In case of the laser, the energy of the laser transforms into heat in the TaN resistive/reflective region 210 (FIG. 2).

As a result, in an alternative embodiment, instead of being electrically written as described above, the OEMC 110*a* can be optically written. More specifically, assuming that a 1 is to be written into the OEMC 110*a*, then the light source/light detecting device 150 can generate the incident beam 162*a* (e.g., a laser) at sufficient intensity to the OEMC 110*a* such that it is as if a voltage pulse with a peak voltage of V2 (i.e., 4V in the example above) were applied across the OEMC 110*a*. In one embodiment, the incident laser beams 162*a* and 162*r* have 1.3 µm wavelength with a laser pulse duration of 15 ns and with a laser energy in a range of 0.6 µj to 1.5 µj. As a result, both the resistance and reflectance of the TaN resistive/reflective region 210 (FIG. 2) increase. This increase in the resistance and reflectance of the TaN resistive/reflective region 210 (FIG. 2) can be subsequently detected electrically and optically as described above.

In an alternative embodiment, instead of operating in the segment B-C of the plot 300 as described above, the OEMC 110*a* operates in the segment X-Y of the plot 400 (FIG. 4A). Operating in the segment X-Y of the plot 400 (FIG. 4A), the OEMC 110*a* can simultaneously be written electrically and read optically, and as a result, can be used to convert an electrical signal into an optical signal.

More specifically, in one embodiment, when the applied voltage is 0V (a 0 for the electrical signal), the TaN resistive/reflective region 210 (FIG. 2) of the OEMC 110*a* has a first reflectance. The light source/light detecting device 150 can detect the same reflectance for both OEMCs 110*a* and 110*r* and accordingly generates a 0 for the optical signal. When the applied voltage is V1 (a 1 for the electrical signal), the TaN resistive/reflective region 210 (FIG. 2) of the OEMC 110*a* has a second reflectance higher than the first reflectance. The light source/light detecting device 150 can detect the reflectance difference between the reflectances of the OEMCs 110*a* and 110*r* and accordingly generates a 1 for the optical signal. In other words, the OEMC 110*a* can be used to convert an electrical signal into an optical signal. In one embodiment, laser wavelengths of 532 nm, 1064 nm, or 1340 nm can be used for the incident laser beams 162*a* and 162*r* used to read the content of the OEMC 110*a* while the OEMC 110*a* operates in the segment X-Y of the plot 400 (FIG. 4A).

Similarly, operating in the segment X-Y of the plot 400 (FIG. 4A), the OEMC 110*a* can simultaneously be written optically and read electrically, and as a result, can be used to convert an optical signal into an electrical signal. In one embodiment, regarding the incident laser beams 162*a* and 162*r*, the energy of the lasers used for optically writing the OEMC 110*a* when the OEMC 110*a* operates in the segment X-Y of the plot 400 (FIG. 4A) can be higher than the energy of the lasers used for optically reading the OEMC 110*a* when the OEMC 110*a* operates in the segment B-C of the plot 300 (FIG. 3) but lower than the energy of the lasers used for optically writing the OEMC 110*a* when the OEMC 110*a* operates in the segment B-C of the plot 300 (FIG. 3).

More specifically, in one embodiment, when the intensity of incident laser beam 162*a* is zero (a 0 for the optical signal), the TaN resistive/reflective region 210 (FIG. 2) of the OEMC 110*a* has a first resistance. The sense-amp circuit 140 can detect the same resistance for both OEMCs 110*a* and 110*r* and accordingly generates a 0 for the electrical signal. When the intensity of incident laser beam 162*a* is at a higher level (a 1 for the optical signal), the TaN resistive/reflective region 210 (FIG. 2) of the OEMC 110*a* has a second resistance higher than the first resistance. The sense-amp circuit 140 can detect the resistance difference between the resistances of the OEMCs 110*a* and 110*r* and accordingly generates a 1 for the electrical signal. In other words, the OEMC 110*a* can be used to convert an optical signal into an electrical signal.

It should be noted that because the changes of the resistance and the reflectance of the TaN resistive/reflective region 210 (FIG. 2) when the OEMC 110*a* operates in the segment X-Y of the plot 400 is smaller than when the OEMC 110*a* operates in the segment B-C of the plot 300, the sense-amp circuit 140 and the light source/light detecting device 150 need to be more sensitive so as to detect small changes of the resistance and the reflectance of the TaN resistive/reflective region 210 (FIG. 2).

In summary, operating in the segment B-C of the plot 300, the OEMC 110*a* can function as a one-time write optoelectronic memory cell which, after be written, can be read many times either electrically or optically. In contrast, operating in the segment X-Y of the plot 400, the OEMC 110*a* can function as an electrical-optical converter for converting back and forth between electrical digital signals and optical digital signals.

In one embodiment, with reference to FIG. 1, the optoelectronic memory device 100 can comprise N OEMCs (not shown) essentially identical to the OEMC 110*a* each of which can store one bit of information (N is a positive integer). For each of these N OEMCs, there needs to be (i) a write switch (not shown but similar to the switch 120, (ii) a read switch (not shown but similar to the switch 130), and (iii) a sense-amp circuit (not shown but similar to the sense-amp circuit 140). Moreover, each of these N OEMCs is optically coupled to the light source/light detecting device 150 in a manner similar to that of the OEMC 110*a*. The operation of each of these N OEMCs is similar to that of the OEMC 110*a*. In one embodiment, all the N OEMCs of the optoelectronic memory device 100 share the same reference OEMC 110r. Alternatively, each of the N OEMCs of the optoelectronic memory device 100 can have its own reference OEMC.

It should be noted that the description of the embodiments above is sufficient such that a person with ordinary skill in the art could practice the invention without undue experimentation.

With reference back to FIG. 2, in the embodiments described above, the resistive/reflective region 210 comprises tantalum nitride TaN. In general, the resistive/reflective region 210 can be a TaN composite stack including multiple layers (not shown). In one embodiment, the resistive/reflective region 210 can be a SiN/TaN/SiO2/SiN composite stack, a SiN/TaN/SiN composite stack, SiN/SiO2/TaN/SiN composite stack, or any other composite stack that includes a TaN core layer. Also, in the embodiments described above, the dielectric layer 240 comprises silicon dioxide $SiO_2$. Alternatively, the dielectric layer 240 can comprise a low-K material such as SiCOH, SiLK, and polymers, etc.

In the embodiments described above, the resistance of the resistive/reflective region 210 (FIG. 2) increases when it absorbs a small heat amount that comes from either a voltage source or a low-energy laser. This is the case shown in FIG. 4A when the material of the resistive/reflective region 210 (FIG. 2) has a positive temperature coefficient of resistance (TCR). Alternatively, the resistance of the resistive/reflective region 210 (FIG. 2) can decrease when it absorbs a small heat amount that comes from either a voltage source or a low-energy laser. This is the case shown in FIG. 4B when the material of the resistive/reflective region 210 (FIG. 2) has a negative TCR.

It should be noted that TaN can have either positive or negative TCR depending on the TaN film fabrication process. However, whether the material of the resistive/reflective region 210 (FIG. 2) has a positive or negative TCR, the light source/light detecting device 150 can recognize a difference (if any) in the reflected beams from the OEMCs 110a and 110r and operate accordingly.

Figure 4B:
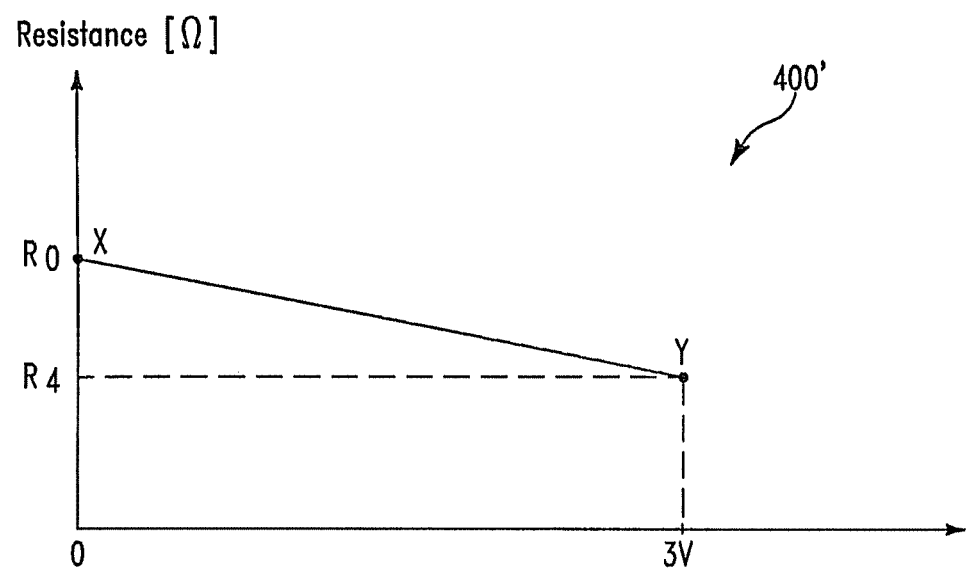

It should also be noted that the voltage values in FIGS. 3, 4A and 4B are for illustration only. Therefore, the scope of the claims are not in any way restricted to these values.

Similarly, in the embodiments described above, the reflectance of the resistive/reflective region 210 (FIG. 2) increases when the resistive/reflective region 210 (FIG. 2) absorbs a small heat amount that comes from either a voltage source or a low-energy laser. Alternatively, the reflectance of the resistive/reflective region 210 (FIG. 2) can decrease when the resistive/reflective region 210 (FIG. 2) absorbs a small heat amount that comes from either a voltage source or a low-energy laser.

It should also be noted that a resistance increase does not necessarily occurs hand-in-hand with a reflectance increase in either reversible or irreversible case. Similarly, a resistance decrease does not necessarily occur hand-in-hand with a reflectance decrease in either reversible or irreversible case. For instance, the inventors of the present invention have found that for a particular resistive/reflective region 210 (FIG. 2), at some heat absorption level, the resistance of the sample 210 increases above the original resistance value while the reflectivity goes below the original reflectance value. But at a certain higher heat absorption level, the resistance of the sample 210 goes below the original resistance value while the reflectivity goes above the original reflectance value.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for changing reflectance of a region in an optoelectronic memory device, said method comprising:
   sending an electric current through the region so as to cause a change in a reflectance of the region from a first value of reflectance to a second value of reflectance different from the first value of reflectance, said region comprising a material; and
   optically reading the change in the reflectance of the region,
   wherein said sending the electric current through the region comprises maintaining a voltage potential across the region so as to cause the change in the reflectance of the region,
   wherein the first value of reflectance corresponding to no voltage potential is maintained across the region, and
   wherein the second value of reflectance corresponding to the voltage potential is maintained across the region.

2. The method of claim 1, wherein said voltage potential is such that the change in the reflectance of the region is reversible.

3. The method of claim 1, wherein said optically reading the change in the reflectance of the region is performed while said voltage potential is being applied across the region.

4. A method for changing reflectance of a region in an optoelectronic memory device, said method comprising:
   sending an electric current through the region so as to cause a change in a reflectance of the region from a first value of reflectance to a second value of reflectance different from the first value of reflectance, said region comprising a material; and
   optically reading the change in the reflectance of the region,
   wherein said optically reading the change in the reflectance of the region comprises:
      sending a first incident laser beam to the region;
      receiving a first reflected beam from the region, wherein the first reflected beam is a result of a reflection of the first incident laser beam off the region;
      sending a second incident laser beam to another reference region, wherein the another reference region is essentially identical to the region;
      receiving a second reflected beam from the another reference region wherein the second reflected beam is a result of a reflection of the second incident laser beam off the another reference region; and
      comparing beam intensities of the first and second reflected beams.

5. A method for changing reflectance of a region in an optoelectronic memory device, said method comprising:
   sending an electric current through the region so as to cause a change in a reflectance of the region from a first value of reflectance to a second value of reflectance different from the first value of reflectance, said region comprising a material; and
   optically reading the change in the reflectance of the region,
   wherein the change in the reflectance of the region is due to a phase change in the material.

6. The method of claim 5, wherein the material comprises TaN.

7. The method of claim 5, wherein said sending the electric current through the region comprises applying a voltage across the region.

8. The method of claim 7, wherein the voltage is such that the reflectance of the region remains at the second reflectance value after the voltage is removed.

9. The method of claim 7, wherein said optically reading the change in the reflectance of the region is performed after the voltage is removed.

* * * * *